United States Patent
Vinet

(10) Patent No.: US 8,115,503 B2
(45) Date of Patent: Feb. 14, 2012

(54) DEVICE FOR MEASURING METAL/SEMICONDUCTOR CONTACT RESISTIVITY

(75) Inventor: Maud Vinet, Rives (FR)

(73) Assignee: Commissariat a l'Energie Atomique, Paris (FR)

( * ) Notice: Subject to any disclaimer, the term of this patent is extended or adjusted under 35 U.S.C. 154(b) by 440 days.

(21) Appl. No.: 12/123,758

(22) Filed: May 20, 2008

(65) Prior Publication Data

US 2008/0297180 A1 Dec. 4, 2008

(30) Foreign Application Priority Data

Jun. 1, 2007 (FR) ...................................... 07 55405

(51) Int. Cl.
*G01R 27/08* (2006.01)
*G01R 31/26* (2006.01)

(52) U.S. Cl. ..................... 324/713; 324/719; 324/762.01

(58) Field of Classification Search .................. 324/691, 324/713–719, 722–724, 762.01–762.1; 257/291
See application file for complete search history.

(56) References Cited

U.S. PATENT DOCUMENTS

| | | | | |
|---|---|---|---|---|
| 4,232,185 A * | 11/1980 | Higuchi et al. | ........... | 174/140 C |
| 4,335,350 A | 6/1982 | Chen | | |
| 5,723,981 A * | 3/1998 | Hellemans et al. | ........... | 324/719 |
| 6,091,248 A * | 7/2000 | Hellemans et al. | ........... | 324/719 |
| 6,144,040 A | 11/2000 | Ashton | | |
| 6,201,401 B1 * | 3/2001 | Hellemans et al. | ........... | 324/719 |
| 6,376,378 B1 * | 4/2002 | Chen et al. | ..................... | 438/692 |
| 6,906,382 B2 * | 6/2005 | Nakabayashi | ................ | 257/336 |
| 7,030,633 B1 | 4/2006 | Qiu et al. | | |
| 7,042,007 B2 * | 5/2006 | Yasui et al. | ...................... | 257/48 |
| 7,253,436 B2 * | 8/2007 | Matsumoto et al. | ............ | 257/48 |
| 2005/0017746 A1 * | 1/2005 | Matsumoto et al. | ........... | 324/763 |
| 2006/0151817 A1 * | 7/2006 | Lee | ................................ | 257/291 |

OTHER PUBLICATIONS

Emmanuel Dubois, et al., "Measurement of Low Schottky Barrier Heights Applied to Metallic Source/Drain Metal-Oxide-Semiconductor Field Effect Transistors", Journal of Applied Physics, vol. 96, No. 1, XP002472027, pp. 729-737, 2004.

Geoffrey K. Reeves, et al., "Electrical Modelling of Kelvin Structures for the Derivation of Low Specific Contact Resistivity", 27th European Solid-State Device Research Conference, Sep. 22-24, 1997, 4 pages.

A.S Holland, et al., "New Challenges of the Modelling of Electrical Characterization of Ohmic Contacts for ULSI Devices", Proc. 22nd International Conference of Microelectronics (MIEL), 2000, vol. 2, May 14-17, 2000, pp. 461-464.

W.M. Loh, et al., "2-D Simulations for Accurate Extraction of the Specific Contact Resistivity from Contact Resistance Data", IEDM, 1985, p. 25.1.

* cited by examiner

*Primary Examiner* — Timothy J Dole
(74) *Attorney, Agent, or Firm* — Oblon, Spivak, McClelland, Maier & Neustadt, L.L.P.

(57) ABSTRACT

A device for measuring the resistivity $\rho_c$ of an interface between a semiconductor and a metal, including at least: one dielectric layer, at least one semiconductor-based element of a substantially rectangular shape, which is arranged on the dielectric layer, having a lengthwise L and widthwise W face in contact with the dielectric layer and having a thickness t, and at least two interface portions containing the metal or an alloy of said semiconductor and said metal, wherein each of two opposing faces of the semiconductor element, having a surface equal to t×W and being perpendicular to the face in contact with the dielectric layer, being completely covered by one of the interface portions.

19 Claims, 5 Drawing Sheets

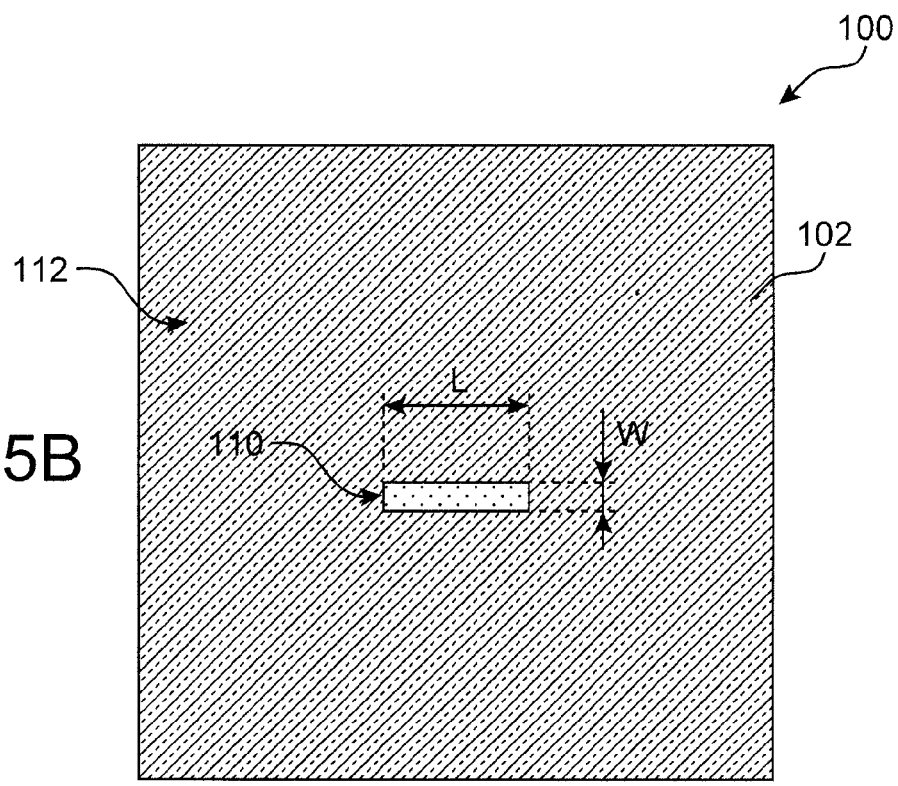
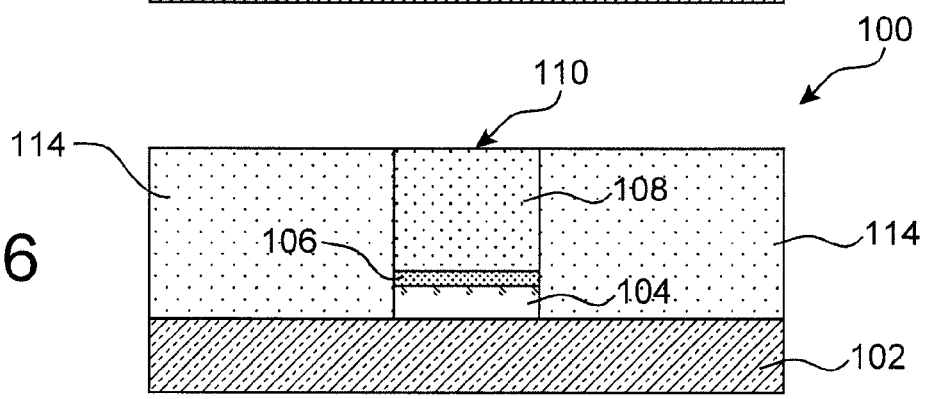
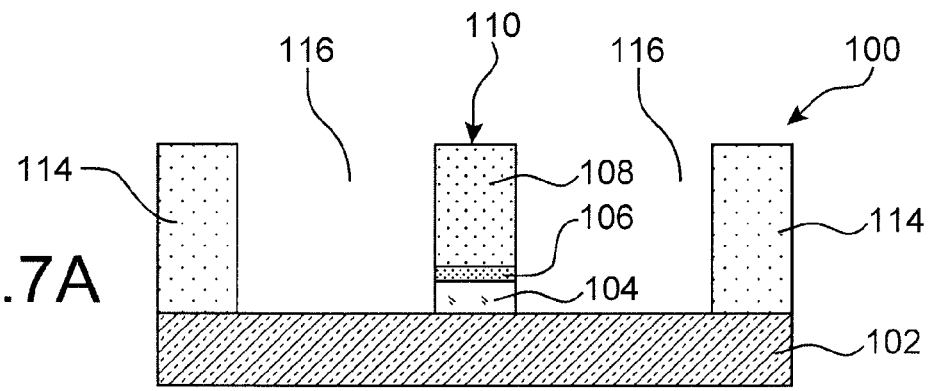

DEVICE FOR MEASURING METAL/SEMICONDUCTOR CONTACT RESISTIVITY

TECHNICAL FIELD AND PRIOR ART

This document relates to a device enabling accurate measurement of the contact resistivity of an interface between a semiconductor and a metal, or an alloy (of the metal and the semiconductor) and the semiconductor. This device is more particularly suitable to vertical interfaces the dimensions of which correspond to those that are found in current thin-film transistors, e.g., formed by the lateral surface of an element having a thickness of between approximately 1 nm and 50 nm and a width of between approximately 30 nm and a few micrometers (typically 2 μm).

The device can be used for accurately characterizing electrical parameters of materials, or for optimizing metal source and drain CMOS transistors by the choice of materials.

Several types of devices currently exist for measuring the contact resistivity between a metal and a semiconductor.

Devices of the "Cross Kelvin Resistor" type (CKR) enable measurement of the Kelvin resistance of an interface formed by a metal and a semiconductor, an approximation of which is equal to $R_K = \rho_c \times S_K$, where $S_K$ is the surface of a contact hole made on a semiconductor-based layer, wherein a portion of the metal is deposited, thus forming the interface of which the contact resistivity $\rho_c$ is to be measured. FIGS. 1 and 2 show a sectional view and top view of such a device, respectively. The CKR device comprises a semiconductor-based substrate 2, e.g., silicon, a contact dielectric 4, e.g., $SiO_2$, a portion of a first metal or silicide 6 in contact with the substrate 2, and a second metal 8 electrically contacting the first metal 6. The semiconductor 2 and the first metal 6 form the interface the resistance $R_K$ of which is intended to be measured by means of current and voltage measurements between the second metal 8 and the semiconductor 2.

However, this CKR device is only suitable for measuring the contact resistivity of a horizontal interface between the first metal 6 and the semiconductor 2, i.e., parallel to the plane formed by the semiconductor substrate 2. Such being the case, the resistivity measurement taken from a horizontal surface such as this is not representative of the contact resistivity of a interface between the metal and the thin-film semiconductor made, for example, in a MOS transistor, due to the space available to the metal for creating the interface, i.e., the surface of the interface, and due to stresses which can facilitate the formation of various alloys at the interface. Furthermore, as described in the documents "Electrical modelling of Kelvin structures for the derivation of low specific contact resistivity" by G. Reeves and al., ESSDERC 1997, and "New challenges of the modelling of electrical characterization of ohmic contacts for ULSI devices" by A. S. Holland and al., international Conf of Microelec (MIEL), 2000, numerous modelling operations and numerical simulations are required in order to extract the exact value of $\rho_c$ because field lines disperse into the semiconductor substrate 2. Thus, with this device, it is difficult to extract an exact value of the specific contact resistivity of the interface. Finally, this device requires the technological creation of a via hole or contact hole demanding minimal dimensions for a given technology. Thus, for the 22 nm technological node, the contact dimensions are approximately 40 nm, which is incompatible with a transistor channel the thickness of which is equal to approximately 10 nm.

Devices of the "Contact End Resistor" (CER) or "Transmission Line Tap Resistor" (TLTR) type likewise enable measurement of the contact resistance of a metal/semiconductor interface. However, in these two cases, as described in the document "2D simulations for accurate extraction of the specific contact resistivity from contact resistance data" by W. M. Loh and al., IEDM 1985, page 25.1, it is very difficult to accurately access the contact resistance, and therefore contact resistivity, because of the uncertainty about the shape of the current lines in such structures. Furthermore, these CER and TLTR devices are only suitable for measuring horizontal interface resistivities.

The document "Measurement of low Schottky barrier heights applied to metallic source/drain metal-oxide-semiconductor field effect transistors" by E. Dubois and al., Journ. Of Appl. Phys., page 729, 2004, describes a flip-flop diode structure enabling Schottky barrier height measurements to be made, but which does not provide direct access to contact resistivity. This type of structure comprises only a single contact at each end of the structure, which prevents the measurement of resistivity. Furthermore, with respect to extraction, and in order to obtain Schottky barrier height measurements, it is necessary to measure temperature.

DISCLOSURE OF THE INVENTION

Thus there is a need to propose a new measurement structure which enables access to the contact resistivity of an interface between a metal, or a semiconductor/metal alloy, which may advantageously be a silicide of said metal, and a semiconductor.

To accomplish this, one embodiment proposes a device for measuring the resistivity $\rho_c$ of an interface between a semiconductor and a metal, comprising at least:
  one dielectric layer,
  at least one semiconductor-based element of a substantially rectangular shape, which is arranged on the dielectric layer, having a lengthwise L and widthwise W face in contact with the dielectric layer and having a thickness t,
  at least two interface portions containing the metal or an alloy of said semiconductor and said metal,
  each of the two opposing faces of the semiconductor element, having a surface equal to t×W and being perpendicular to the face in contact with the dielectric layer, being completely covered by one of the interface portions.

The element arranged on the dielectric layer may consist of the semiconductor and/or be a semiconductor element. The interface portions may consist of the metal or an alloy of the semiconductor and the metal and/or be interface portions of a metal or of an alloy of the semiconductor and metal.

This unitary device enables measurement of the contact resistivity between a semiconductor and a metal on the basis of the crystal orientation of the semiconductor, e.g., by choosing the starting orientation of the semiconductor or else by designing structures which are oriented in various directions on the mask used for the lithography mask.

This device is suitable for transistor geometries with metal source and drain regions.

Furthermore, contrary to other devices, wherein the interfaces are all horizontal, this device has a geometry corresponding to the reality of the devices comprising tested interfaces formed by the metal and the semiconductor, e.g., transistors. The grain size of the materials can then be considered as representative, because manufacture of the materials takes account of the stresses specific to the vertical geometry of the interfaces, e.g., by taking account of stresses during the production of silicides, which modify the binary, ternary and quaternary phase diagrams of the materials.

Finally, this type of unitary device results in an actual resistivity measurement, because the field lines are parallel at the measurement level, owing, for example to the use of a substrate of the SOI type (silicon-on-insulator), the semiconductor element then being silicon-based and arranged on a dielectric layer.

The device may further comprise:
at least two other semiconductor-based elements, arranged on the dielectric layer, each of these two elements then being of a substantially rectangular shape, having a lengthwise L and widthwise W face in contact with the dielectric layer, and having a thickness t, which is substantially similar to the thickness of the other elements, the widths W of the three semiconductor elements being different from one another, at least two of the three lengths L of the three semiconductor elements being different from one another,
at least four other interface portions containing a metal or an alloy of said semiconductor and said metal,
each of two opposing faces of one of the other two semiconductor elements having a surface equal to t×W and being perpendicular to the face in contact with the dielectric layer, is capable of being completely covered by one of the other four interface portions.

An assemblage of several unitary devices is thus formed, enabling implementation of a measuring method for extracting the resistivity $\rho_c$ of an interface between a semiconductor and a metal.

Another embodiment also relates to a device for measuring the resistivity $\rho_c$ of an interface between a semiconductor and a metal, which may comprise at least:
one dielectric layer,
at least three semiconductor-based elements arranged on the dielectric layer, each element being of a substantially rectangular shape, having a lengthwise L and a widthwise W face in contact with the dielectric layer, and having a thickness t, which is substantially similar to the thickness of the other elements, the widths W of the three elements being different from one another, at least two of the three lengths L of the three elements being different from one another,
at least six interface portions containing a metal or an alloy of said semiconductor and said metal,
each of two opposing faces of the semiconductor element, having a surface equal to t x W and being perpendicular to the face in contact with the dielectric layer, being completely covered by one of the interface portions.

Each interface portion may be electrically connected to at least two metal contacts.

Each metal contact may comprise a stack of metal layers, these metal layers possibly containing titanium nitride and tungsten.

The interface portions may contain a silicide of said metal.

The widths W and lengths L may be between approximately 30 nm and 2 μm.

The semiconductor may be silicon and/or germanium and/or silicon-germanium, the metal possibly being platinum, and/or nickel, and/or titanium, and/or erbium.

When it comprises at least three semiconductor elements and six interface portions, the device may further comprise:
means of applying voltage U between two interface portions covering two opposing faces of a single semiconductor element,
means of measuring a current I flowing through the semiconductor elements and through the interface portions,
means of calculating resistance R=U/I for each of the semiconductor elements and interface portions,
means of calculating a linear regression of the function R=f(W), such that R=a. W+b, with a and b being real numbers, from calculations of R and the widths W of the various semiconductor elements which may be of the same length,
means of calculating $$W_{actual} = W - \frac{b}{a}$$

for each value of W,
means of calculating a linear regression of the function R=f(L), such that R=c. L+d, with c and d being real numbers, from calculations of R and the lengths L of the various semiconductor elements which may be of the same width,
means of calculating:

$\rho_c = 2R_c \times W_{actual} \times t$, with $2R_c = d$.

The linear regression of the function R=f(L) and/or the calculation of $\rho_c$ may be performed for all of the different W, thereby making it possible to obtain statistical data (mean, standard deviation . . . ).

Another embodiment also relates to a process of manufacturing a device for measuring the resistivity $\rho_c$ of an interface between a semiconductor and a metal, comprising at least the steps of:
forming, on a dielectric layer, at least one semiconductor-based element of a substantially rectangular shape, having a lengthwise L and a widthwise W face in contact with the dielectric layer and having a thickness t,
forming at least two interface portions containing a metal or an alloy of said semiconductor and said metal, each of two opposing faces of the semiconductor element, having a surface equal to W×t and being substantially perpendicular to the face in contact with the dielectric layer, is capable of being completely covered by one of the interface portions.

The step of forming the semiconductor element may also form, on the dielectric layer, at least two other semiconductor-based elements, each of these two elements being of a substantially rectangular shape, having a lengthwise L and widthwise W face in contact with the dielectric layer, and having a thickness t, which is substantially similar to the thickness of the other elements, the widths W of the three semiconductor elements being different from one another, at least two of the three lengths L of the three semiconductor elements being different from one another.

The step for forming the two interface portions may also form at least four other interface portions containing a metal or an alloy of said semiconductor and said metal, each of two opposing faces of one of the other two semiconductor elements having a surface equal to W×t and being substantially perpendicular to the face in contact with the dielectric layer, is capable of being completely covered by one of the other four interface portions.

One embodiment may also relate to a process of manufacturing a device for measuring the resistivity $\rho_c$ of an interface between a semiconductor and a metal, capable of comprising at least the steps of:
forming, on a dielectric layer, at least three semiconductor-based elements, each element being of a substantially rectangular shape, having a lengthwise L and widthwise W face in contact with the dielectric layer, and having a thickness t which is substantially similar to the thickness of the other elements, the widths W of the three elements being different from one another, at least two of the three lengths L of the three elements being different from one another, forming at least six interface portions containing the metal or an alloy of said semiconductor and said metal, each of two opposing faces of a semiconductor element, having a surface equal to W×t and being substantially perpendicular to the face in contact with the dielectric layer, is capable of being completely covered by one of the interface portions.

The formation of the semiconductor element or elements may be obtained by implementing at least the following steps:

forming, on the dielectric layer, a stack comprising a semiconductor-based layer on which a second dielectric layer and a layer capable of forming an etching mask are deposited, forming, in the mask layer, a mask pattern comprising at least the substantially rectangular shape or shapes of lengths L and widths W of the semiconductor elements, etching the mask layer, the second dielectric layer and the semiconductor-based layer according to the pattern formed in the mask layer.

The stack may be formed via depositions, e.g., CVD depositions (Chemical Vapour Deposition) or PECVD (Plasma-Enhanced Chemical Vapour Deposition), of the second dielectric layer and the mask layer on a semiconductor-on-insulator type substrate, said substrate forming the dielectric layer and the semiconductor-based layer.

During formation of the stack, between the deposition of the second oxide layer and the deposition of the mask layer, the process may further comprise a step of doping the semiconductor-based layer through the second dielectric layer.

The pattern may be formed in the mask layer by implementing a photolithography or electron-beam lithography step.

Formation of the interface portions may be obtained by implementing at least the following steps:

deposition of a dielectric material at least on the dielectric layer, definition of locations in the dielectric material, via photolithography or electron-beam lithography, and etching of same, which is capable of exposing the two opposing faces of the semiconductor element or each of the semiconductor elements having a surface equal to W×t and being perpendicular to the face in contact with the dielectric layer, deposition of the metal into the locations, said two opposing faces of the semiconductor element or each of the semiconductor elements being completely covered by the metal, forming the interface portions and at least two metal contacts electrically connected to each interface portion, when the interface portions are metal-based.

In order to form the interfaces, when the interface portions contain the metal/semiconductor alloy, and after the step of depositing the metal into the locations, the process may further include:

an anneal, which transforms the metal in contact with the semiconductor element or elements into the metal/semiconductor alloy, this alloy being capable of forming the interface portions, elimination of the metal that has not been transformed into the metal/semiconductor alloy.

After the step of eliminating the metal that has not been transformed into the metal/semiconductor alloy, the process may further include a step of depositing, in a portion of the locations that has been opened up by the elimination of the metal that was not transformed into the metal/semiconductor alloy, a stack of metal layers capable of forming at least two metal contacts which are electrically connected to each interface portion.

The crystal orientation of the interfaces the resistivity of which is to be measured may be defined by the initial crystal orientation of the starting substrate and/or by the crystal orientation of the lithographs produced during the process.

One embodiment may also relate to a method of measuring the resistivity of an interface between a semiconductor and a metal formed on a device comprising:

a dielectric layer, at least three semiconductor-based elements arranged on the dielectric layer, each element being of a substantially rectangular shape, having a lengthwise L and a widthwise W face in contact with the dielectric layer, and having a thickness t substantially similar to the thickness of the other elements, the widths W of the three elements being different from one another, at least two of the three lengths L of the elements being different from one another, at least six interface portions, each of the two opposing faces of a semiconductor element, having a surface equal to t×W and being perpendicular to the face in contact with the dielectric layer, is capable of being completely covered by one of the interface portions, the measuring method comprising at least the following steps:

application of voltage U between two interface portions covering two opposing faces of a single semiconductor element, measurement of a current I flowing through the semiconductor elements and through the interface portions, calculation of the resistance R=U/I for each of the semiconductor elements and the interface portions, calculation of a linear regression of the function R=f(W), such that R=a.W+b, with a and b being actual numbers, from the calculations of R and the widths W of the various semiconductor elements, calculation of $W_{actual}$=W−b/a for each value of W, calculation of a linear regression of the function R=f(L), such that R=c. L+d, with c and d being actual numbers, from the calculations of R and the lengths L of the various semiconductor elements, calculation of $\rho_c$=2$R_c$×$W_{actual}$×t, with 2$R_c$=d.

BRIEF DESCRIPTION OF THE DRAWINGS

This invention will be better understood upon reading the description of exemplary embodiments given for purely illustrative and non-limiting purposes, with reference to the appended drawings, in which:

FIGS. 3 to 9 show the steps of a process for manufacturing a device for measuring the resistivity of an interface between a semiconductor and a metal.

Identical, similar or equivalent portions of the various figures described hereinbelow bear the same numerical references, so as to facilitate moving from one figure to another.

The various portions shown in the figures are not necessarily shown at a uniform scale, in order to render the figures more legible.

The various possibilities (alternatives and embodiments) should be understood as being mutually non-exclusive and capable of being combined with one another.

DETAILED DISCLOSURE OF PARTICULAR EMBODIMENTS

Reference is made first to FIGS. 3 to 8, which show the steps of a process for manufacturing a device 100 for measuring the resistivity of an interface between a semiconductor and a metal.

Figure 1:
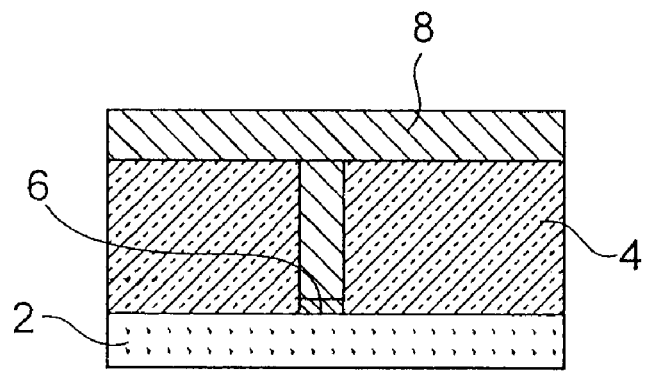
FIGS. 1 and 2 show a sectional view and a top view, respectively, of a CKR-type structure.
Figure 2:
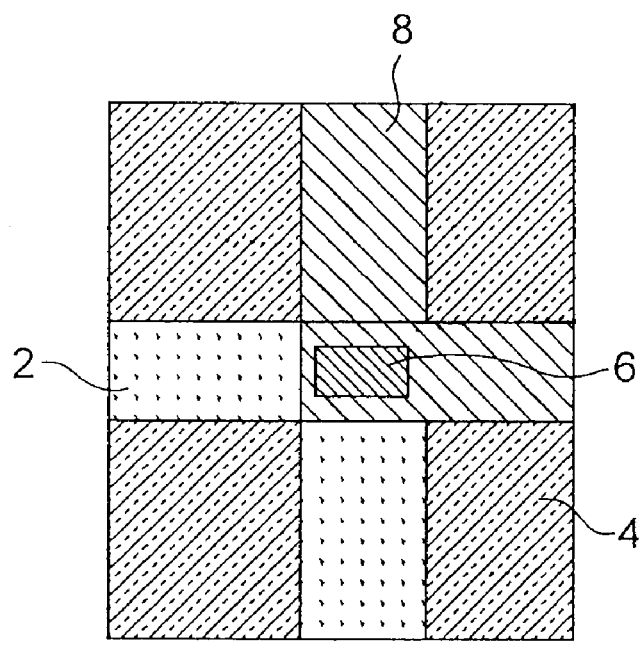
Figure 3:
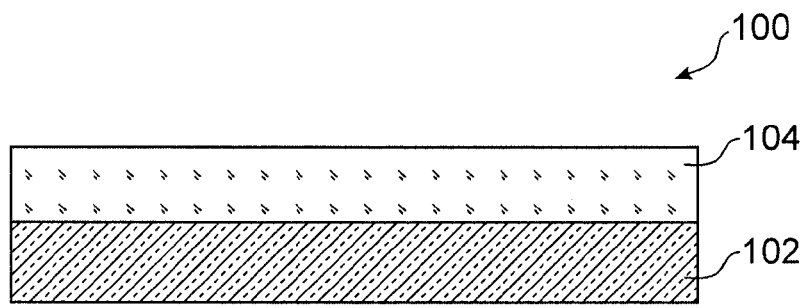

As shown in FIG. 3, the process is implemented by starting with a stack comprising a dielectric layer 102, in this case being oxide-based and having a thickness equal to approximately 145 nm, on which is deposited a semiconductor-based layer 104 intended to form the interface, e.g., made of silicon, and having a thickness equal to approximately 70 nm. In this case, the dielectric layer 102 and the semiconductor-based layer 104 thus form an SOI-type substrate. In one alternative, the semiconductor of layer 104 could likewise be germanium, then forming, together with the dielectric layer 102, a GeOI (germanium-on-insulator) type substrate. The dielectric layer 102 and the semiconductor-based layer 104 generally form a semiconductor-on-insulator type substrate.

The thickness $t_{si}$ of the layer 104 to be characterized is then defined. In this embodiment, this thickness is equal to approximately 20 nm. To accomplish this, thermal oxidation of the surface of layer 104 is carried out, over a thickness equal to approximately 50 nm. Next, the oxide layer formed on layer 104 is removed, in this case by deoxidizing with hydrofluoric acid, the remaining silicon layer 104 then having a thickness equal to approximately 20 nm. Generally speaking, the thickness $t_{si}$ of layer 104 may be between 1 nm and 50 nm. The thickness $t_{si}$ of layer 104 may be accurately measured by spectroscopic ellipsometry.

A second dielectric layer 106, e.g., oxide-based and having a thickness of between approximately 2 nm and 10 nm, is then deposited on this silicon layer 104, e.g., via PECVD or CVD.

Doping of the silicon layer 104 through the oxide layer 106 is then carried out, e.g., via ion implantation performed by a beam of arsenic ions having an energy equal to approximately 5 KeV and a concentration equal to approximately $1.10^{15}$ atoms/cm². The oxide layer 106 enables the structural defects produced during ion implantation to be stored. An anneal for electrical activation of the dopants is then carried out, e.g., a so-called "Spike" anneal at approximately 1050° C., in order to reduce and adjust the resistance of the silicon layer 104 $R_{si}$ such that $R_{si} \leq 100 \times R_c$, with $R_c$ being the contact resistance of the interfaces of which the resistivity is to be measured.

Figure 4:
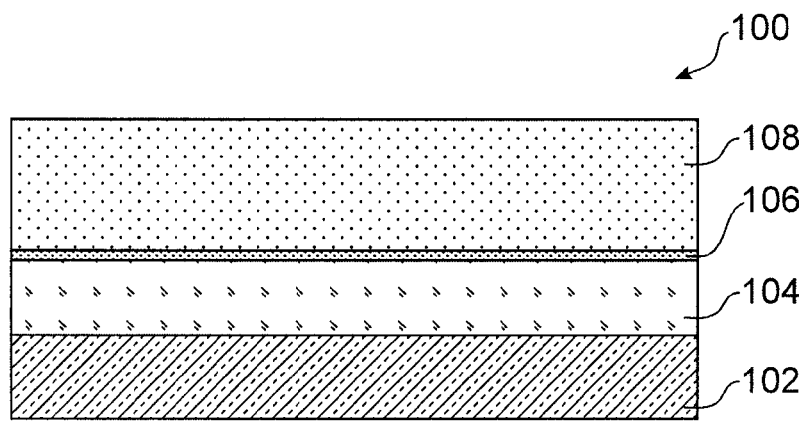

As shown in FIG. 4, a nitride layer 108 is then deposited, e.g., via CVD or PECVD deposition, thereby forming a etching mask layer, having a thickness sufficient to be used as a barrier layer during chemical mechanical planarization (CMP). The thickness of this nitride layer 108 is, for example, between approximately 100 nm and 200 nm. The oxide layer 106 thus forms a mechanical link between the silicon layer 104 and the nitride layer 108.

Figure 5A:
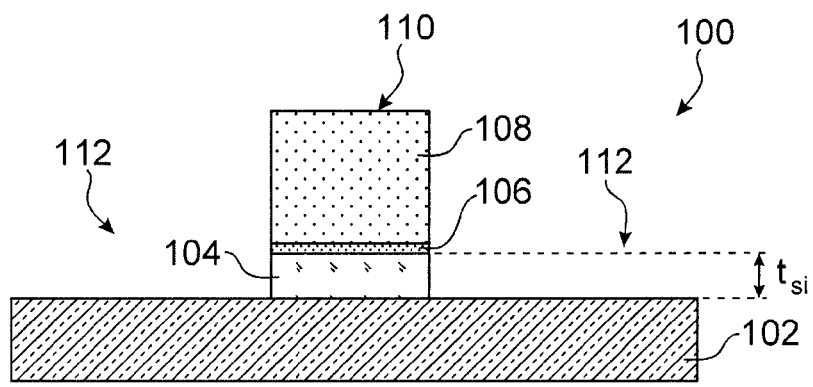

The nitride layer 108 is, in this case, a mask layer enabling formation of an etching mask which will be used to etch the oxide layer 106 and the silicon layer 104. A pattern is first made in the nitride layer 108, e.g., via photolithography or electron-beam lithography, this pattern forming an etching mask defining active regions and insulating regions of the device 100. As shown in FIGS. 5A (sectional view) and 5B (top view), an etching is made, e.g., a reactive ionic etching, thereby etching the insulating regions 112 and retaining the active regions 110. In this case, the device 100 comprises three active regions 110. In FIGS. 5A to 8, a single active region 110 comprising a remaining portion of the silicon 104, oxide 106 and nitride 108 layers is shown, the regions from which portions of the silicon 104, oxide 106 and nitride 108 layers were eliminated thus form the insulating regions 112 of the device 100.

The active region 110, for example, has a length L and a width W of between approximately 30 nm and 2 µm. Thus, the silicon layer forms a silicon element 104 of length L, width W and thickness $t_{si}$, this silicon element 104 forming the semiconductor portion of the interface the resistivity of which will be measured subsequently. The other active regions of the device 100, not shown, are dimensioned such that each active region comprises a length L and width W which are different from one another. Structure 100 is preferably made with at least three active regions of various lengths and of the same width, and three active regions of various widths and of identical length. The structure 100 could likewise be made with four active regions, three of these regions comprising different widths, two of these regions comprising a first length and two other regions comprising a second length different from the first. It is likewise possible for the device 100 to comprise three active regions, the widths W of the three active regions being different from one another, and at least two of the three lengths L of the three active regions being different from one another.

Next, the entire device 100 is covered with a dielectric material, in this case an oxide layer 114, deposited, for example, at a low temperature, via PECVD, and a planarization, for example a chemical-mechanical planarization, of this oxide layer 114 is carried out, while stopping at the nitride layer 108 (FIG. 6).

Figure 7B:
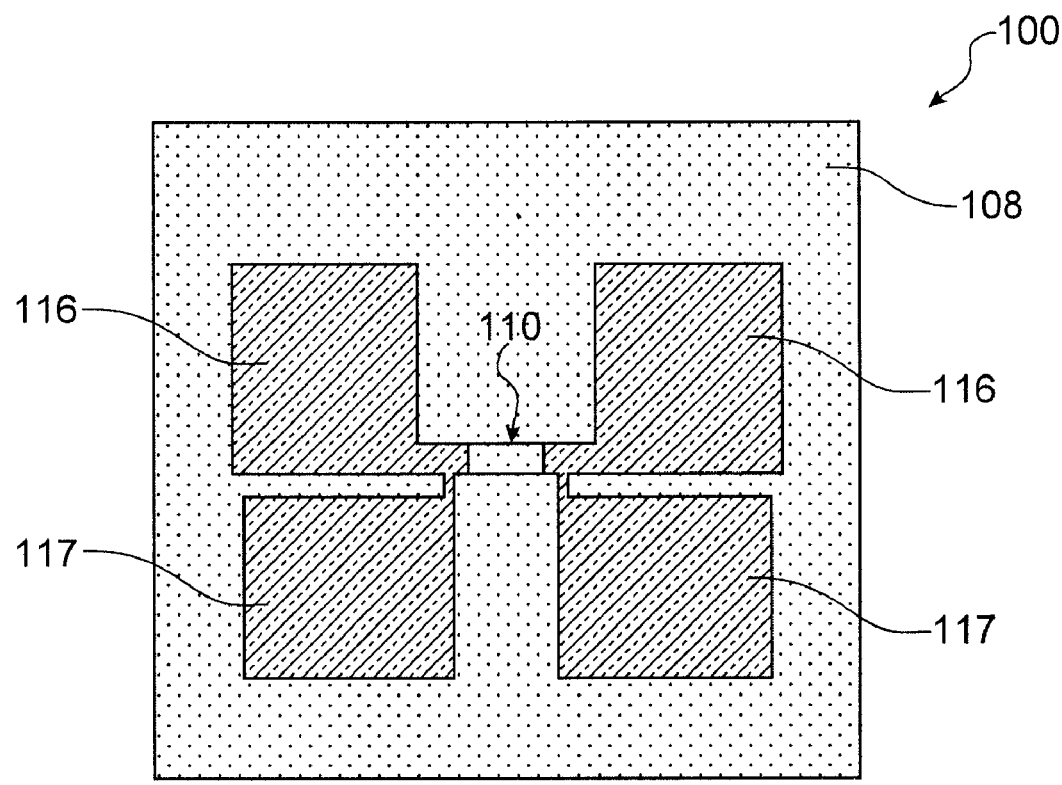

As shown in FIGS. 7A (sectional view) and 7B (top view), a second lithography step is implemented, enabling definition of four locations 116 and 117 in the oxide layer 114 around each semiconductor element 104, these locations next being etched into the oxide layer 114, e.g., by plasma etching, the dielectric layer 102 serving as a barrier layer. This etching likewise makes it possible to expose two opposing faces of the silicon element 104 having a surface equal to t×W and being perpendicular to the face in contact with the dielectric layer 102. These locations 116 and 117 are intended to receive metal and to thereby form four metal contacts around each semiconductor element 104, the two metal contacts intended to be made in the locations 116 most distant from silicon element 104 being used to measure the current passing through the silicon element 104, the two metal contacts intended to be made in the locations 117 closest to the silicon element 104 being used to measure the voltage at the terminals of the silicon element 104.

Figure 8:
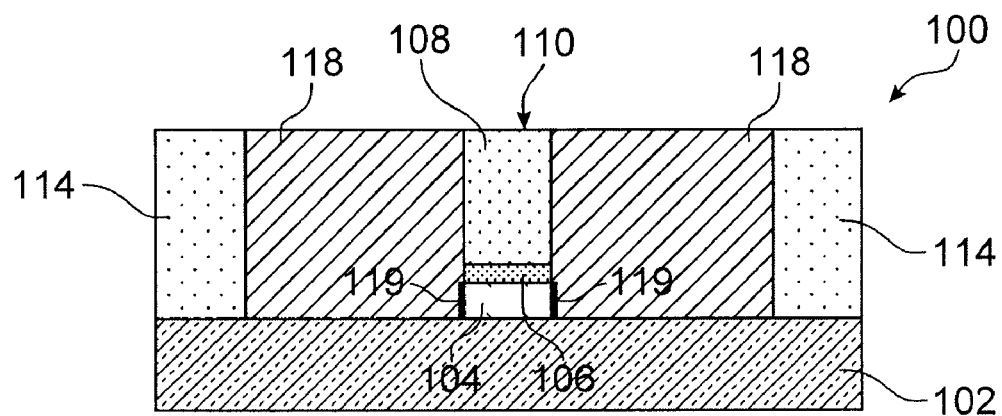

The locations 116 and 117 are then filled with the metal intended to form the interface with the semiconductor of elements 104 (FIG. 8). For example, a first layer containing said metal, which can be capable of forming a silicide together with the silicon 104, such as platinum, and/or nickel, and/or titanium, and/or erbium, is deposited in the locations 116 and 117. After an anneal enabling formation of the silicide-based interface portions 119, the remaining metal is selectively removed in relation to the silicide, e.g., by using aqua regia (a mixture comprising nitric acid and hydrochloric acid), in the case of selective removal of platinum. The locations 116 are then filled with a stack 118 of metal layers consisting of metals of different resistivities, e.g., titanium nitride and tungsten. The stack 118 is then chemical-mechanical planarized, thereby enabling removal of the metal situated outside of locations 116 and 117.

Using this device 100, it is now possible to measure the contact resistivity at the vertical interfaces, between the silicide of the interface portions 119 and the silicon 104, by means of the metal contacts 118.

Using the silicon elements 104 of the same length L and of various widths W, and by applying voltages U to the terminals of these elements 104 by means of the metal contacts made, and by measuring the current I flowing through these elements 104, and the interface portions 119, R (=U/I) is first plotted, on the basis of the various values of W for the silicon elements 104. For example, it is possible to plot a linear regression of this curve from three values of R. As a matter of fact, at the terminals of each of the silicon elements 104, $R=R_{si}+2R_c$. Thus, the calculated resistance R for a silicon element 104 corresponds to the resistance $R_{si}$ of the silicon portion 104 and of the contact resistance $R_c$ of the two interfaces between the silicon 104 and an interface portion 119. It is thus possible to write the equation: $R=\rho_{si} \times W \times L + 2\rho_c \times t \times W$. Given that there may be a difference between the actual dimensions W, L and the theoretical values $W_{designed}$ and $L_{designed}$, it is possible to extract a $\Delta W$ from the plotted curve, such that $W_{actual} = W_{designed} + \Delta W$, corresponding to the value of W of the curve for R=0.

Next, R is plotted with respect to L, for all designed widths ($W_{designed}$), e.g., three if the device comprises 3 semiconductor elements 104 having different lengths L from one another. If the length L of the silicon elements 104 is well known, then the original ordinate (for L=0) is equal to $2R_c = \rho_c/(W_{actual} \times t_{si})$. Thus, it is possible to deduce therefrom the value for the resistivity $\rho_c$ of the interface between the semiconductor 104 and the silicide of the interface portions 119 in contact with this semiconductor 104. If there is an uncertainty about the width, then by positioning at a given length L, it is also possible to obtain the value for $\rho_c$ from the relationship: $R_{w1}(L) - R_{w2}(L) = 2\rho_c/(t_{si} \times (W1-W2))$. The value for the resistivity $\rho_c$ is then deduced therefrom.

Figure 9:
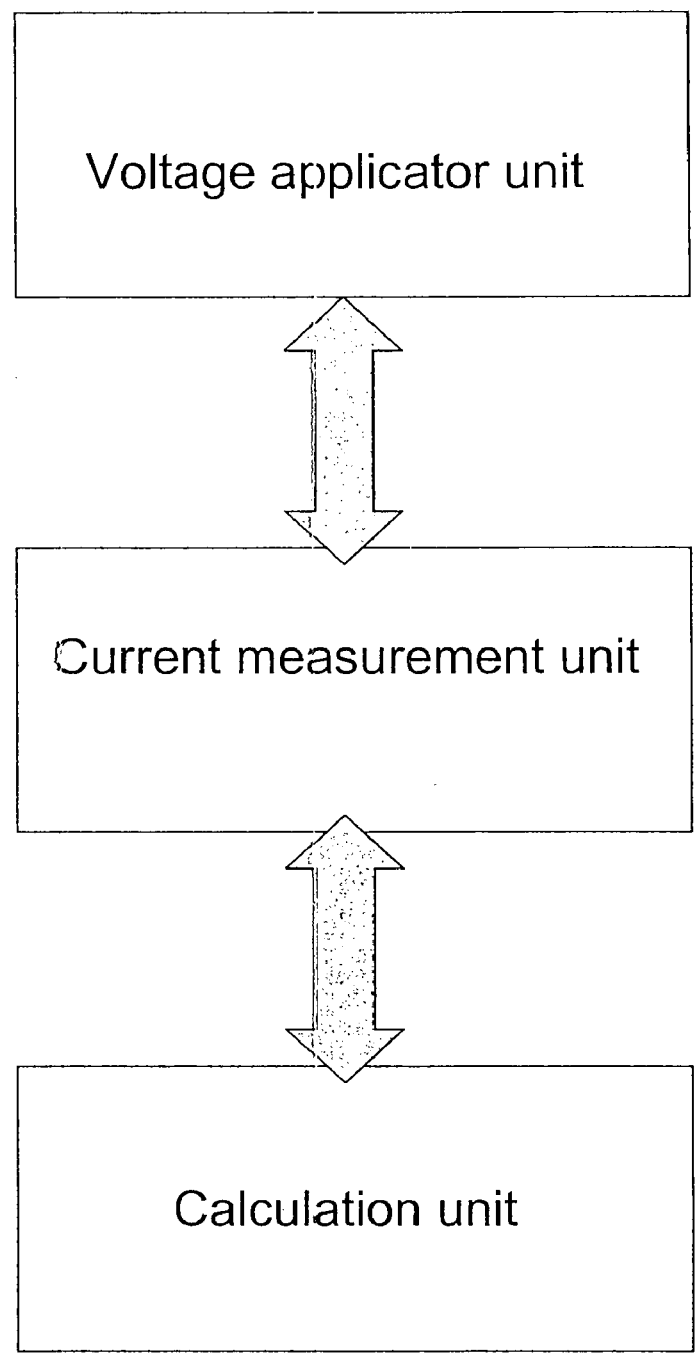

Conventional means enabling the application of voltage U and the measurement of currents I, as well as conventional means for performing the above calculations, may be integrated into the device 100, and are illustrated in FIG. 9.

The invention claimed is:

1. A device for measuring the resistivity $\rho_c$ of an interface between a semiconductor and a metal, comprising at least:
   one dielectric layer,
   at least three semiconductor-based elements of a substantially rectangular shape, which are arranged on the dielectric layer, having a lengthwise L and widthwise W face in contact with the dielectric layer and having a thickness t,
   at least six interface portions containing the metal or an alloy of said semiconductor and said metal,
   wherein each of two opposing faces of the semiconductor-based elements, having a surface equal to t×W and being perpendicular to the face in contact with the dielectric layer, being completely covered by one of the interface portions,
   means for applying voltage U between two interface portions covering two opposing faces of a single semiconductor-based element,
   means for measuring a current I flowing through the semiconductor-based elements and through the interface portions,
   means for calculating resistance R=U/I for each of the semiconductor-based elements and interface portions,
   means for calculating a linear regression of the function R=f(W), such that R=a.W +b, with a and b being real numbers, from calculations of R and the widths W of the various semiconductor-based elements,
   means for calculating $$W_{actual} = W - \frac{b}{a}$$

for each value of W,
   means for calculating a linear regression of the function R=f(L), such that R=c.L +d, with c and d being real numbers, from calculations of R and the lengths L of the various semiconductor-based elements, and
   means for calculating $\rho_c = 2R_c \times W_{actual} \times t$, with $2R_c = d$, wherein $R_c$ is contact resistance.

2. The device of claim 1, further comprising:
   at least two other semiconductor-based elements, arranged on the dielectric layer, each of these two other semiconductor-based elements being of a substantially rectangular shape, having a lengthwise L and widthwise W face in contact with the dielectric layer, and having a thickness t, which is substantially similar to the thickness of the semiconductor-based element, the widths W of the three semiconductor-based elements being different from one another, at least two of the three lengths L of the three semiconductor-based elements being different from one another,
   at least four other interface portions containing a metal or an alloy of said semiconductor and said metal, and
   each of two opposing faces of one of the other two semiconductor-based elements, having a surface equal to t×W and being perpendicular to the face in contact with the dielectric layer, is capable of being completely covered by one of the other four interface portions.

3. The device of claim 1, wherein each interface portion is electrically connected to at least two metal contacts.

4. The device of claim 3, wherein each metal contact includes a stack of metal layers.

5. The device of claim 4, wherein the metal layers include titanium nitride and tungsten.

6. The device of claim 1, wherein the interface portions include a silicide of said metal.

7. The device of claim 1, wherein the thickness t is between 1 nm and 50 nm, and the widths W and lengths L are between 30 nm and 2 µm.

8. The device of claim 1, wherein the semiconductor includes at least one of silicon, germanium, and silicon-germanium.

9. The device of claim 1, wherein the semiconductor is doped.

10. The device of claim 1, wherein the metal includes at least one of platinum, nickel, titanium, and erbium.

11. A process of manufacturing a device for measuring the resistivity $\rho_c$ of an interface between a semiconductor and a metal, comprising at least the steps of:
    forming, on a dielectric layer, at least three semiconductor-based elements of a substantially rectangular shape, having a lengthwise L and a widthwise W face in contact with the dielectric layer and having a thickness t,
    forming at least six interface portions containing a metal or an alloy of said semiconductor and said metal,
    wherein each of two opposing faces of the semiconductor-based elements, having a surface equal to W×t and being substantially perpendicular to the face in contact with the dielectric layer, are completely covered by one of the interface portions,
    applying voltage U between two interface portions covering two opposing faces of a single semiconductor-based element, measuring a current I flowing through the semiconductor-based elements and through the interface portions, calculating resistance R=U/I for each of the semiconductor-based elements and interface portions, calculating a linear regression of the function R=f(W), such that R=a.W+b, with a and b being real numbers, from calculations of R and the widths W of the various semiconductor-based elements, calculating $$W_{actual} = W - \frac{b}{a}$$

for each value of W, calculating a linear regression of the function R=f(L), such that R=c.L+d, with c and d being real numbers, from calculations of R and the lengths L of the various semiconductor-based elements, and calculating $\rho_c=2R_c=W_{actual} \times t$, with $2R_c=d$, wherein $R_c$ is contact resistance.

12. The process of claim 11, wherein:
the forming the semiconductor-based elements also includes forming, on the dielectric layer, at least two other semiconductor-based elements, each of these two other semiconductor-based elements being of a substantially rectangular shape, having a lengthwise L and widthwise W face in contact with the dielectric layer, and having a thickness t, which is substantially similar to the thickness of the semiconductor-based elements, the widths W of the three semiconductor-based elements being different from one another, at least two of the three lengths L of the three semiconductor-based elements being different from one another, and the forming the six interface portions also includes forming at least four other interface portions containing a metal or an alloy of said semiconductor and said metal, each of two opposing faces of one of the other two semiconductor-based elements having a surface equal to W×t and being perpendicular to the face in contact with the dielectric layer, are completely covered by one of the other four interface portions.

13. The process of claim 11, the forming of the semiconductor-based elements comprises:
forming, on the dielectric layer, a stack comprising a semiconductor-based layer on which a second dielectric layer and a layer capable of forming an etching mask are deposited, forming, in a mask layer, a mask pattern comprising at least the substantially rectangular shape or shapes of lengths L and widths W of the semiconductor-based elements, and etching the mask layer, the second dielectric layer and the semiconductor-based layer according to the pattern formed in the mask layer.

14. The process of claim 13, wherein the stack is obtained via depositions of the second dielectric layer and the mask layer on a semiconductor-on-insulator substrate, said semiconductor-on-insulator substrate forming the dielectric layer and the semiconductor-based layer.

15. The process of claim 14, further comprising, during formation of the stack, between a deposition of an oxide layer and a deposition of the mask layer, doping the semiconductor-based layer through the second dielectric layer.

16. The process of claim 13, wherein the mask pattern is formed in the mask layer via implementation of photolithography or electron-beam lithography.

17. The process of claim 13, wherein the forming of the interface portions comprises:
depositing a dielectric material at least on the dielectric layer, defining locations in the dielectric material, via photolithography or electron-beam lithography, and etching of same, which is capable of exposing the two opposing faces of each of the semiconductor-based elements having a surface equal to W×t and being perpendicular to the face in contact with the dielectric layer, depositing the metal into the locations, said two opposing faces of the semiconductor-based elements being completely covered by the metal, and forming the interface portions and at least two metal contacts electrically connected to each interface portion, when the interface portions are metal-based.

18. The process of claim 17, further comprising, in order to form the interfaces, when the interface portions contain the metal/semiconductor alloy, and after the step of depositing the metal into the locations:
annealing, which transforms the metal in contact with the semiconductor-based elements into the metal/semiconductor alloy, this alloy being capable of forming the interface portions, and eliminating the metal that has not been transformed into the metal/semiconductor alloy.

19. The process of claim 18, further comprising, after the eliminating the metal that was not transformed into the metal/semiconductor alloy, depositing, in a portion of the locations opened up by the elimination of the metal that has not been transformed into the metal/semiconductor alloy, a stack of metal layers forming at least two metal contacts which are electrically connected to each interface portion.

* * * * *